United States Patent
Kim et al.

(10) Patent No.: US 8,119,486 B2
(45) Date of Patent: Feb. 21, 2012

(54) METHODS OF MANUFACTURING SEMICONDUCTOR DEVICES HAVING A RECESSED-CHANNEL

(75) Inventors: Young-Pil Kim, Hwaseong-si (KR); Eun-Ae Chung, Hwaseong-si (KR); Gab-Jin Nam, Seoul (KR); Hee-Don Hwang, Seoul (KR); Ji-Young Min, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 12/984,176

(22) Filed: Jan. 4, 2011

(65) Prior Publication Data

US 2011/0201168 A1 Aug. 18, 2011

(30) Foreign Application Priority Data

Feb. 16, 2010 (KR) .................. 10-2010-0013901

(51) Int. Cl.
*H01L 21/336* (2006.01)

(52) U.S. Cl. ............. 438/270; 257/E21.41; 257/E21.55; 257/E21.585; 257/E21.655; 257/E29.201; 257/E29.26

(58) Field of Classification Search ............. 257/E21.41, 257/E21.55, E21.655, E29.201, E29.06, E21.585; 438/259, 270

See application file for complete search history.

(56) References Cited

U.S. PATENT DOCUMENTS

| | | | |
|---|---|---|---|
| 6,630,389 B2 | 10/2003 | Shibata et al. | |
| 7,378,312 B2* | 5/2008 | Kim ............................ | 438/243 |
| 2001/0034109 A1 | 10/2001 | Madson et al. | |
| 2002/0106892 A1 | 8/2002 | Shibata et al. | |
| 2008/0303086 A1* | 12/2008 | Ueda et al. .................... | 257/330 |
| 2009/0001482 A1* | 1/2009 | Kang .......................... | 257/390 |
| 2009/0152625 A1 | 6/2009 | Lee et al. | |
| 2010/0258858 A1* | 10/2010 | Kim ............................ | 257/330 |
| 2011/0108914 A1* | 5/2011 | Denison et al. ............... | 257/337 |

FOREIGN PATENT DOCUMENTS

| | | |
|---|---|---|
| JP | 2002-231945 | 8/2002 |
| KR | 10-2009-0063603 | 6/2009 |

\* cited by examiner

*Primary Examiner* — Asok Sarkar
(74) *Attorney, Agent, or Firm* — Harness, Dickey & Pierce, P.L.C.

(57) ABSTRACT

A method according to example embodiments includes forming isolation regions in a substrate, the isolation regions defining active regions. Desired regions of the active regions and the isolation regions are removed, thereby forming recess channel trenches to a desired depth. The recess channel trenches are fog to have a first region in contact with the active regions and a second region in contact with the isolation regions. A width of a bottom surface of the recess channel trenches is less than that of a top surface thereof. The active regions and the isolation regions are annealed to uplift the bottom surface of the recess channel trenches. An area of the bottom surface of the first region is increased. A depth of the bottom surface of the first region is reduced.

20 Claims, 6 Drawing Sheets

METHODS OF MANUFACTURING SEMICONDUCTOR DEVICES HAVING A RECESSED-CHANNEL

CROSS-REFERENCE TO RELATED APPLICATION

This application claims priority under 35 U.S.C. §119 to Korean Patent Application No. 2010-0013901, filed Feb. 16, 2010, the contents of which are hereby incorporated herein by reference in their entirety.

BACKGROUND

1. Field

Example embodiments relate to methods of manufacturing recessed channel array transistors (RCAT).

2. Description of Related Art

With an increase in the integration density of semiconductor devices, the design rule of memory cell decreases. A length of gate channel decreases, as memory cells become highly integrated. Presently, a semiconductor substrate is recessed to form trenches and gate electrodes are buried in the trenches, whereby the length of the gate channel may increase.

SUMMARY

According to example embodiments, a method of manufacturing a semiconductor device includes forming at least one isolation region in a substrate, the at least one isolation region defining at least one active region; recessing a desired region of the at least one active region and the at least one isolation region to form a recessed channel trench of a desired depth, the recessed channel trench having a first region in contact with the at least one active region and a second region in contact with the at least one isolation region, and a width of a bottom surface of the recessed channel trench being less than a width of a top surface of the recessed channel trench; annealing the at least one active region and the at least one isolation region to uplift the bottom surface of the recessed channel trench, the annealing resulting in an increase in an area of the bottom surface of the first region, a reduction in a depth of the bottom surface of the first region, and a width of a bottom surface of the first region being substantially similar to a top surface of the first region, and the annealing process resulting in no change in the second region; and forming a buried gate electrode in the recessed channel trench.

According to example embodiments, a level of the bottom surface of the first region is substantially identical to a level of the bottom surface of the second region during the recessing process, and wherein, during the annealing process, the level of the bottom surface of the first region is higher than the level of the bottom surface of the second region.

According to example embodiments, a level of the bottom surface of the first region is higher than that of the bottom surface of the second region during the recessing process, and wherein, during the annealing process, the level of the bottom surface of the first region is substantially higher than the level of the bottom surface of the second region as compared to the level of the bottom surface during recessing process.

According to example embodiments, the level of the bottom surface of the first region is lower than that of the bottom surface of the second region during the recessing process, and wherein, during the annealing process, the level of the bottom surface of the first region is substantially identical to the level of the bottom surface of the second region as compared to the level of the bottom surface during recessing process.

According to example embodiments, recessing the at least one active region and the at least one isolation region includes performing a high-density plasma (HDP) dry etching process.

According to example embodiments, annealing the at least one active region and the at least one isolation region includes performing a reflow process in a hydrogen or oxygen atmosphere.

According to example embodiments, the at least one isolation region surrounds the at least one active region, the at least one active region is in a bar shape having a length greater than a width, and wherein the at least one active region is a portion of an array of active regions, and the recessed channel trench and the at least one active region are at an angle with respect to each other.

According to example embodiments, the gate electrode includes a gate insulating pattern, a gate conductive pattern and a gate capping pattern, which are buried in the recessed channel trench.

According to example embodiments, the method of manufacturing the semiconductor device, further includes recessing the desired region of the at least one active region and the at least one isolation region to form the recessed channel trench, wherein the recessed channel trench includes at least one recessed-channel, and a level of the bottom surface of the recessed at least one active region is higher than a level of the bottom surface of the recessed at least one isolation region; and annealing the substrate, wherein a level of a bottom surface of the annealed at least one active region is substantially higher than a level of a bottom surface of the annealed at least one isolation region as compared to the level of the bottom surface of the recessed at least one active region.

According to example embodiments, during the recessing process, a width of the bottom surface of the recessed at least one active region is less than a width of the top surface of the recessed at least one active region, and wherein, compared to the recessing process, during the annealing process an area of the bottom surface of the annealed at least one active region increases, a level of the bottom surface of the annealed at least one active regions is uplifted by at least 10 nm and there is no change in the bottom surface of the annealed at least one isolation region.

According to example embodiments, the annealed at least one active region protrudes from the at least one isolation region, and the at least one recessed-channel extends on three sides of a top surface and both sidewalls to fowl multi-channels of a fin-type.

According to example embodiments, forming the at least one isolation region includes forming at least one isolation trench in the substrate using a photolithography and etching process; filling the at least one isolation trench with an insulating material; and removing the insulating material to expose the substrate.

According to example embodiments, recessing the at least one active region and the at least one isolation region includes sequentially forming a pad insulating layer and a mask layer on the substrate; patterning the pad insulating layer and the mask layer to form pad insulating patterns and mask patterns which partially expose the at least one isolation region and the at least one active region; and partially removing the at least one isolation region and the at least one active region to a desired depth using the mask patterns as an etch mask.

According to example embodiments, the level of the bottom surface of the recessed at least one active region is higher than the level of the bottom surface of the recessed isolation regions, and wherein the at least one isolation region has a high selectivity with respect to the at least one active region such that the at least one isolation region is etched more than the at least one active region.

According to example embodiments, the method of manufacturing the semiconductor device, further includes forming a gate insulating layer along a profile of the recessed channel trench; forming a gate conductive layer on the gate insulating layer; partially removing the gate conductive layer and the gate insulating layer using a chemical mechanical polishing (CMP) technique or an etchback (E/B) technique to form gate insulating patterns and gate conductive patterns, the gate conductive patterns having top surfaces that are lower than the top surface of the substrate; forming a gate capping layer on the gate conductive patterns; and partially removing the gate capping layer using a chemical mechanical polishing (CMP) technique or an etchback (E/B) till the substrate is exposed, thereby forming gate capping patterns.

According to example embodiments, the method of manufacturing the semiconductor device, further includes recessing the desired region of the at least one active region and the at least one isolation region to form the recessed channel trench including at least one recessed-channel, wherein a level of the bottom surface of the recessed at least one active region is lower than a level of a bottom surface of the recessed at least one isolation region; and annealing the substrate, wherein a level of a bottom surface of the annealed at least one active region is substantially identical to a level of a bottom surface of the annealed at least one isolation region.

According to example embodiments, during the recessing process, a width of the bottom surface of the recessed at least one active region is less than a width of the top surface of the recessed at least one active region, and wherein, compared to the recessing process, during the annealing process an area of the bottom surface of the annealed at least one active region increases, a level of the bottom surface of the annealed at least one active region is uplifted and there is no change in the bottom surface of the annealed at least one isolation region.

According to example embodiments, recessing the at least one active region and the at least one isolation region includes performing a high-density plasma (HDP) dry etching process, and wherein annealing the at least one active region and the at least one isolation region includes performing a reflow in a N2 atmosphere for curing the silicon damaged by the high-density plasma.

According to example embodiments, the method of manufacturing the semiconductor device, further includes forming a gate insulating layer along a profile of the recessed channel trench in-suit with the annealing process; forming a gate conductive layer on the gate insulating layer using a chemical vapor deposition (CVD) technique; partially removing the gate conductive layer and the gate insulating layer using an etchback (E/B) technique to form gate insulating patterns and gate conductive patterns, wherein the gate conductive patterns have top surfaces that are lower than those of the substrate; forming a gate capping layer on the gate conductive patterns using a chemical vapor deposition (CVD) technique; and partially removing the capping layer using a chemical mechanical polishing (CMP) technique until a top surface of the substrate is exposed to form gate capping patterns.

According to example embodiments, the method of manufacturing a semiconductor device, further includes forming source regions and drain regions using the capping patterns as an ion implantation mask, wherein vertical-type recessed-channels are formed under the gate insulating patterns by the source regions and the drain regions.

BRIEF DESCRIPTION OF THE DRAWINGS

The above and other features and advantages will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EXAMPLE EMBODIMENTS

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Referring to FIGS. 1, 2D, 3C and 4C, a plurality of active regions 120 defined by isolation regions 130 may be repetitively arranged at predetermined/desired intervals in a substrate 100. The active regions 120 may have an oblong shape, wherein a major axis thereof may be in a first direction of FIG. 1. Gate electrodes 200 may be arranged parallel to each other such that one active region 120 may intersect at least two gate electrodes 200. The gate electrodes 200 may extend in a second direction different from the first direction. The second direction may at an angle with respect to the first direction. A third direction may be at right angles to the second direction. For example, the second direction may be considered as the X-axis and the third direction may be considered as the Y-axis such that the active regions 120 may be at a desired angle with respect to the X-axis and the Y-axis.

Figure 1:
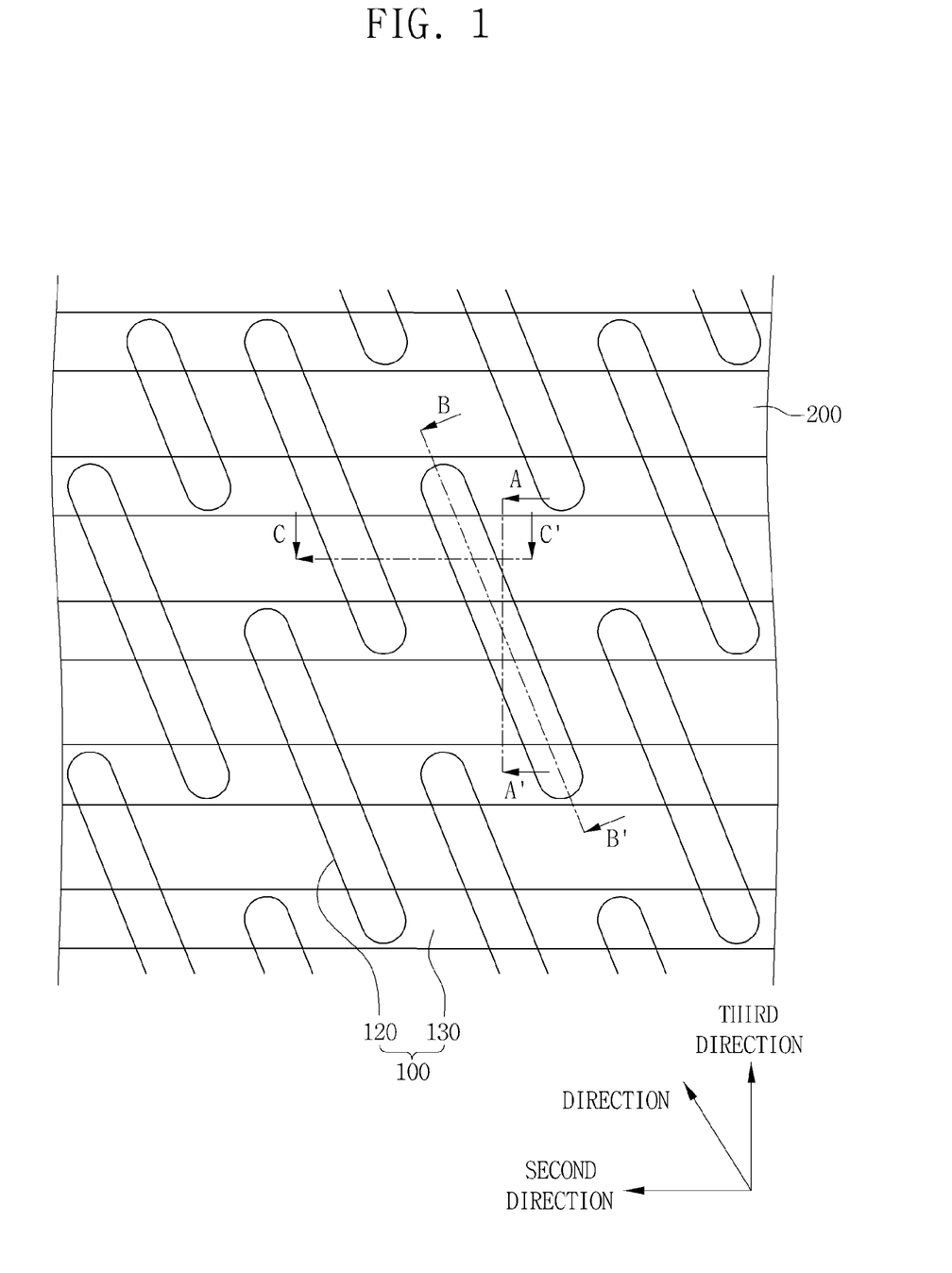
FIG. 1 illustrates the layout of a semiconductor device having a recessed-channel according to example embodiments.

For example, one active region 120 may have two unit cells, each unit cell having the X-axis length of 2F, the Y-axis length of 6F, and an area of 6F2, based on the minimum feature. In the 6F2 cell structure, the active regions 120 may be defined as a bar-type by the isolation regions 130 and tilted in a direction diagonal to the gate electrodes 200 to minimize a cell area.

Figure 2A:
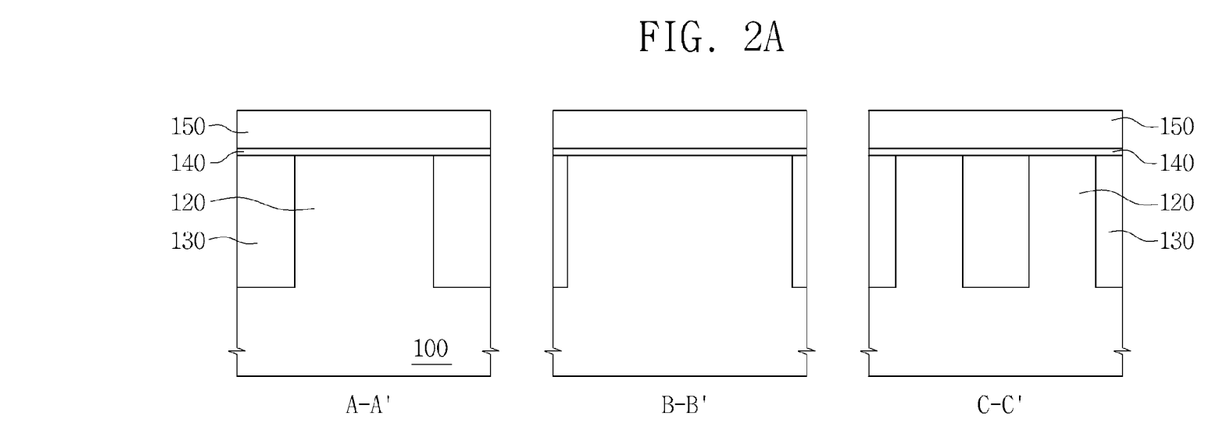
FIGS. 2A through 2D are longitudinal sectional views taken along lines A-A', B-B' and C-C' of FIG. 1, which illustrate a method of manufacturing a semiconductor device according to example embodiments.
Figure 2B:
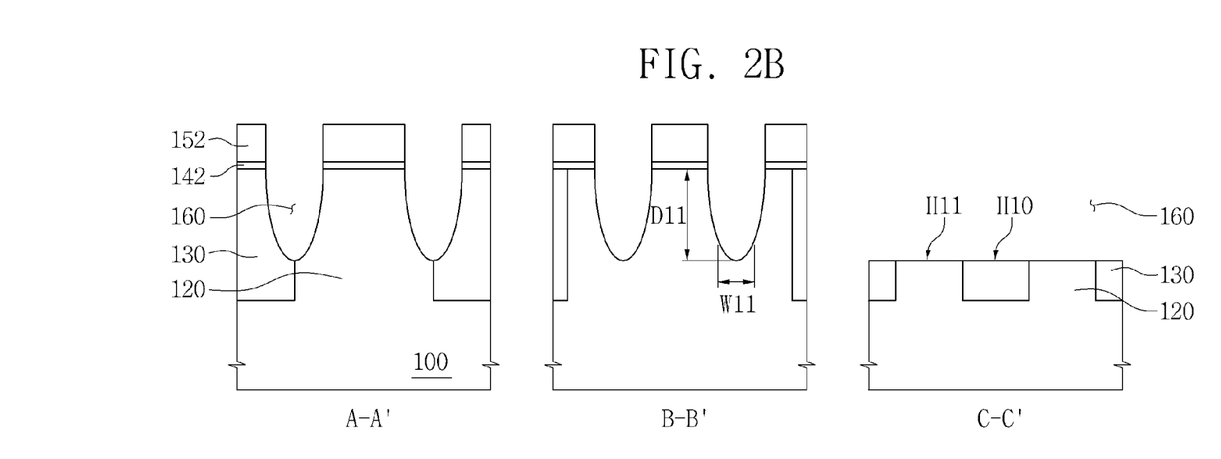
Figure 2C:
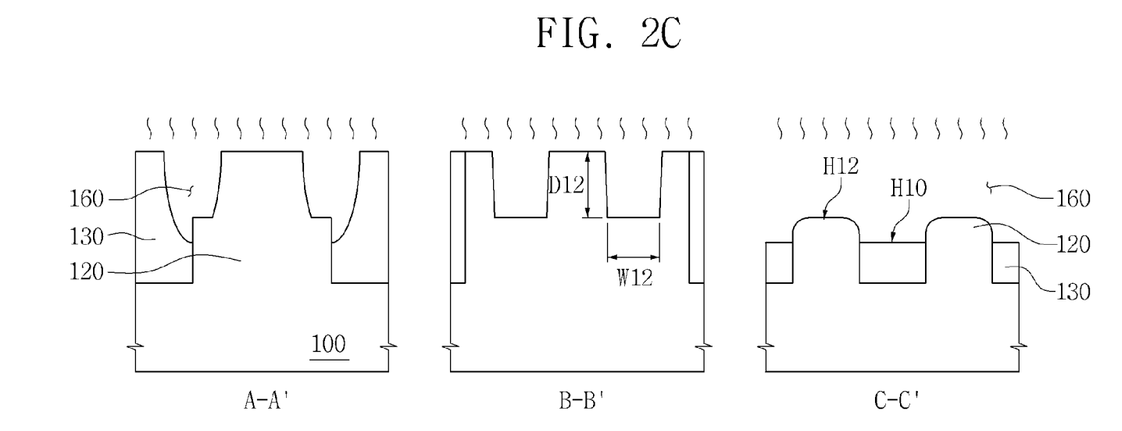
Figure 2D:
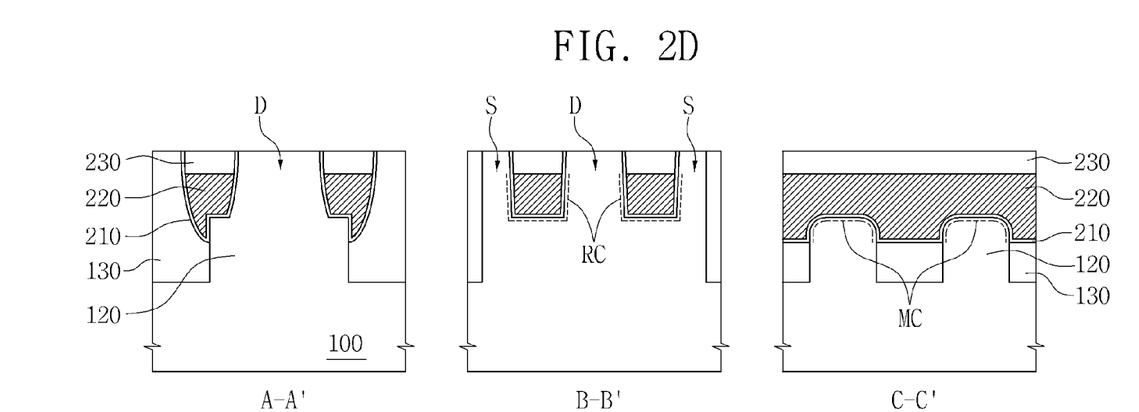
Figure 3A:
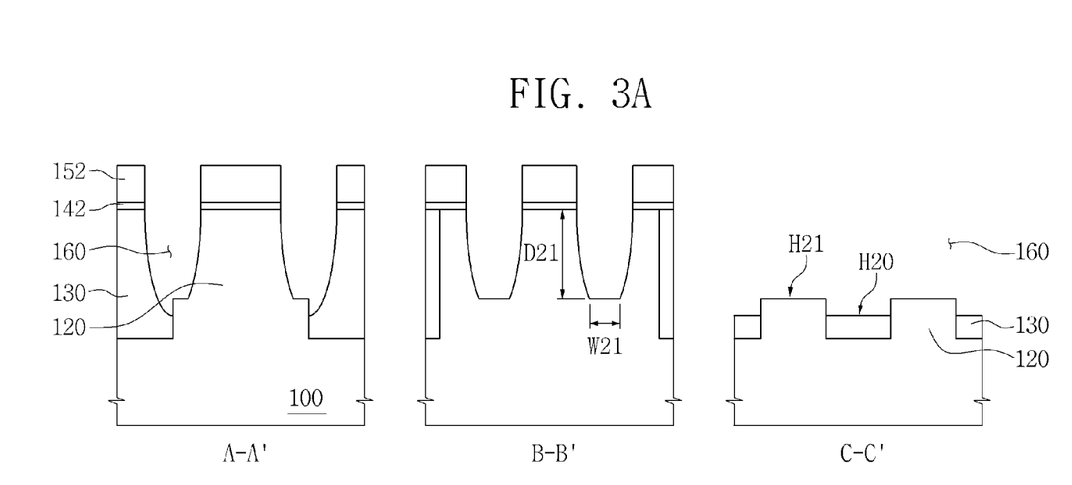
FIGS. 3A through 3C are longitudinal sectional views taken along lines A-A', B-B' and C-C' of FIG. 1, which illustrate a method of manufacturing a semiconductor device according to example embodiments.
Figure 3B:
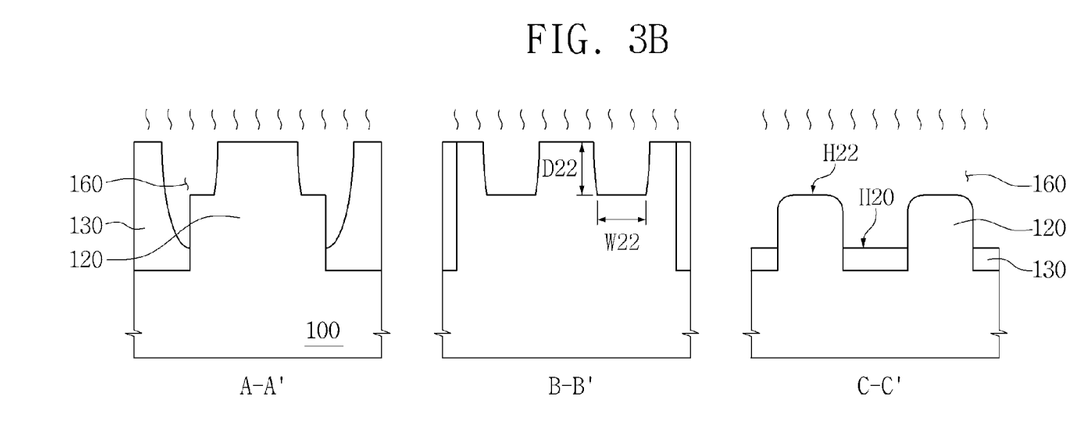
Figure 3C:
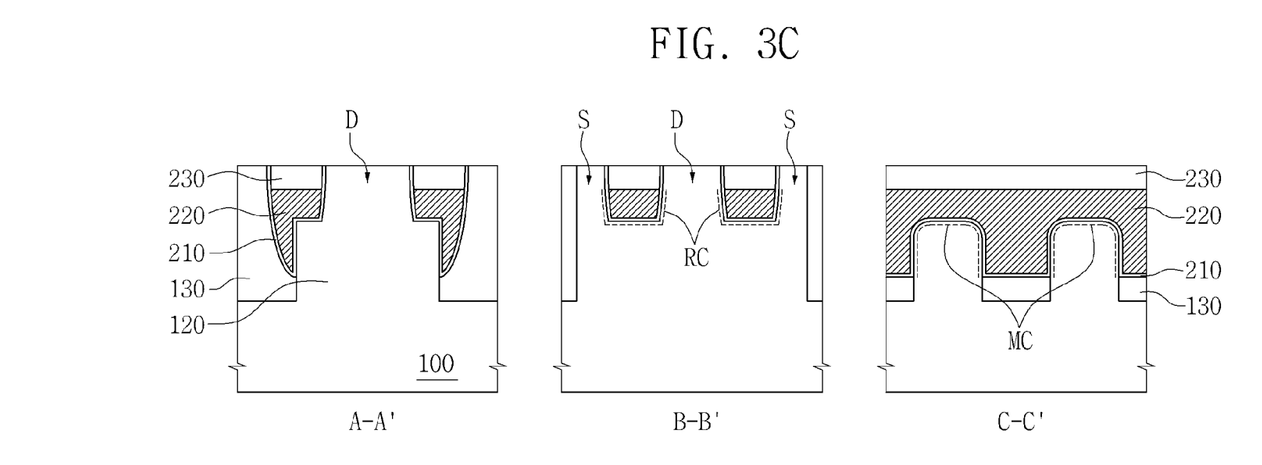
Figure 4A:
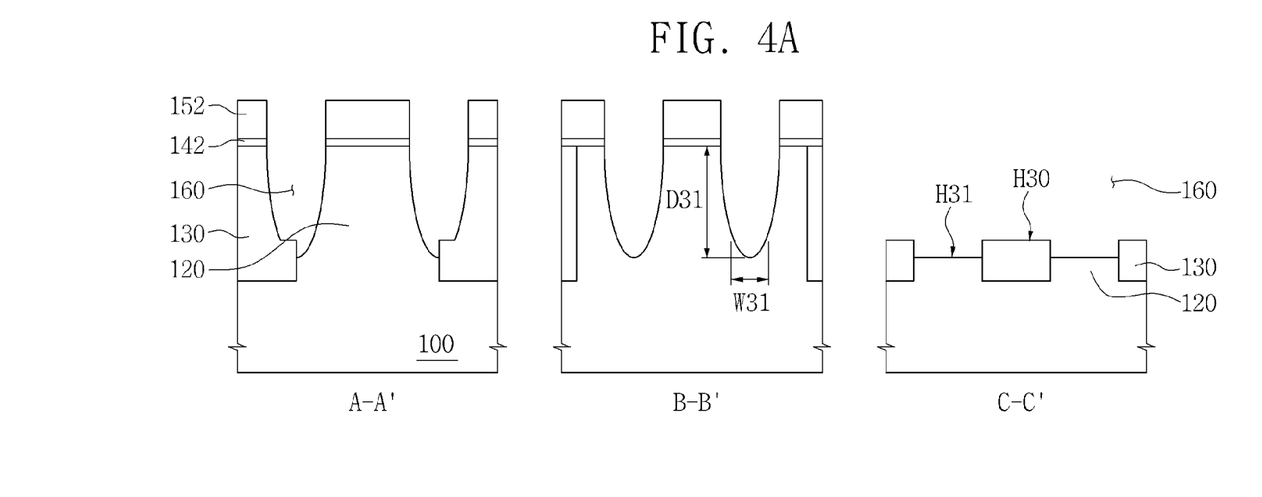
FIGS. 4A through 4C are longitudinal sectional views taken along lines A-A', B-B' and C-C' of FIG. 1, which illustrate a method of manufacturing a semiconductor device according to example embodiments.
Figure 4B:
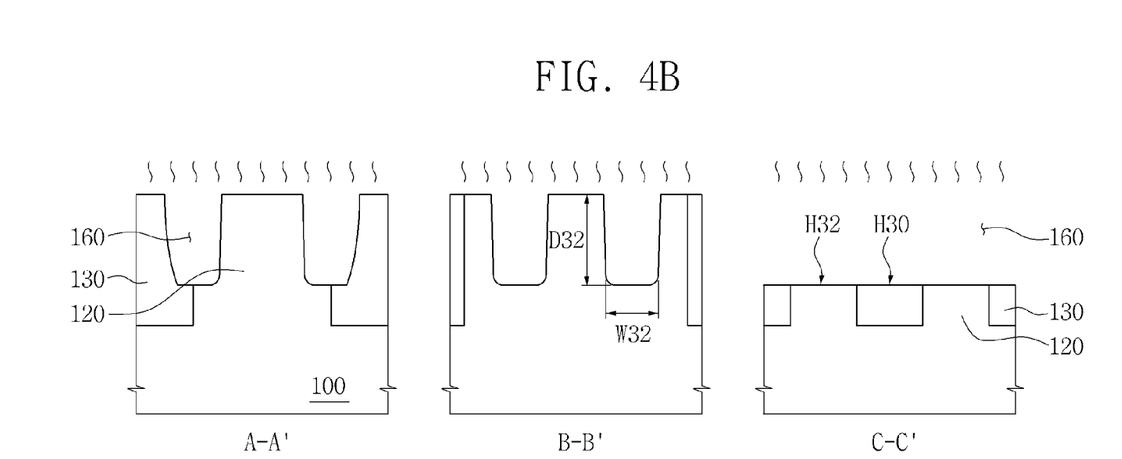
Figure 4C:
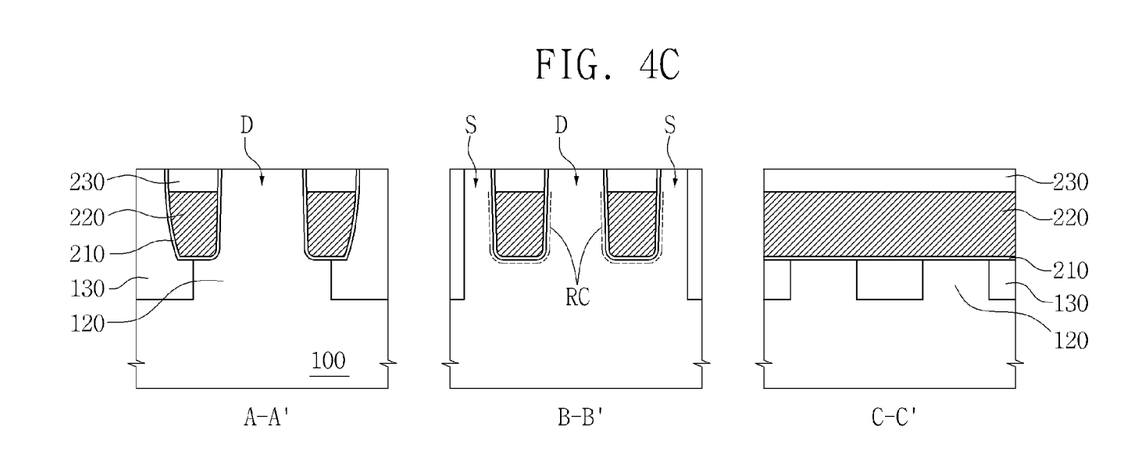

Referring to FIGS. 2D, 3C and 4C, the gate electrodes 200 may include recessed-channels RC arranged as a vertical-type in a vertical direction to the substrate 100. For example, gate electrodes 200 including the recessed channels RC may be buried in the substrate 100 and a length of the recessed-channels RC may be increased to improve a short-channel effect and/or punch-through. The gate electrodes 200 may include gate insulating patterns 210, gate conductive patterns 220 and/or gate capping patterns 230, which may be buried in recess channel trenches (refer to 160 in FIGS. 2C, 3B and 4B) to have a recess structure.

Referring to FIGS. 2D and 3C, gate electrodes 200 may cover a top surface and/or both sidewalls of the active regions 120 to increase a width of the recessed-channels RC. According to example embodiments, the channel in recessed channel array transistor (RCAT) may be formed as a vertical-type recess-channels RC so that a length of the channel may be increased compared to planer-type transistor. The active regions 120 may protrude from the isolation regions 130, whereby the recessed-channels RC may be formed over three sides in total. According to example embodiments, the channel may be formed as multi-channels MC which may extend over three sides such that a width of the multi-channels MC may be increased compared to single channel. Accordingly, length and/or width of the channel may be increased in the recessed-channels RC shape and the multi-channels MC shape, respectively.

As stated above, the gate electrode 200 may be buried in the recess channel trenches 160 of the active regions 120 thereby increasing the length of the channel. The active regions 120 may protrude as a fin-type and the multi-channels MC may extend over three sides, thereby increasing the width of the channel and the mount of cell current in width direction of the recessed-channels RC. Therefore, even though the length and/or width of the channel decreases as a design rule is reduced, the multi-channels MC and the recessed-channels RC may prevent degradation in cell currents characteristic. As a result, a threshold voltage of cell may be increased and a small doping energy may ensure enough threshold voltage margin to improve a refresh characteristic.

Hereinafter, methods of manufacturing semiconductor devices according to example embodiments will be described.

FIGS. 2A through 2D are longitudinal sectional views taken along lines A-A', B-B' and C-C' of FIG. 1, which illustrate a method of manufacturing a semiconductor device according to example embodiments.

Referring to FIGS. 1 and 2A, an isolation process may be performed. Isolation trenches (not shown) may be formed in a substrate 100. The isolation trenches may be filled with an insulating material, thereby forming isolation regions 130 defining active regions 120. The substrate 100 may be formed of silicon single crystal or silicon germanium. The insulating material may be formed of boron phosphorus silicate glass (BPSG), undoped silicate glass (USG) and/or a high-density plasma (HDP) oxide. For example, the isolation regions 130 may be formed using shallow trench isolation (STI) technique. By the STI technique, isolation trenches may be formed in the substrate 100 using photolithography and/or plasma etching process and the above insulating material is formed in the isolation trenches using a spin coating process and/or a chemical vapor deposition (CVD) process, and the insulation material is removed until the substrate is exposed.

The active regions 120 may have a bar shape having a greater length than a width. The isolation regions 130 may surround the active regions 120, whereby the active regions 120 may have an isolated island shape, for example. The active regions 120 may be disposed in a diagonal direction to gate electrodes 200 that are formed later.

Pad insulating layer 140 and mask layer 150 may be sequentially formed on the substrate 100. The pad insulation layer 140 may be composed of a silicon oxide layer which is formed by an oxidation process. The mask layer 150 may be composed of a silicon nitride layer which is fowled by a chemical vapor deposition (CVD) process.

Referring to FIG. 2B, a process of recessing a substrate for recessed-channel RC may be performed. The pad insulating layer 140 and mask layer 150 may be patterned using photolithography and/or etching processes, thereby forming pad insulating patterns 142 and mask patterns 152, respectively. Top surfaces of the isolation regions 130 and active regions 120 may be partially exposed by the pad insulating patterns 142 and mask patterns 152.

The isolation regions 130 and active regions 120 may be partially removed to a predetermined/desired depth using the mask patterns 152 as an etch mask. Thus, recess channel trenches 160 may be formed in a second direction of the substrate 100. The plurality of recess channel trenches 160 may be repetitively arranged in third direction of the substrate 100.

The recess channel trenches 160 may be formed using a high-density plasma (HDP) dry etching process. For example, the HDP dry etching process may be preformed at a pressure of about 5 mtorr to 50 mtorr and at a power of about 50 W to 100 W. In this case, during the HDP dry etching process, the surface of the silicon substrate 100 exposed by the recess channel trenches 160 may be significantly damaged by the plasma.

Referring to FIG. 2B, it can be seen that, when the predetermined/desired region of the active regions 120 are removed using the recessing process, cross sections of the recess channel trenches 160 taken along line B-B' may be cone shaped (or alternatively 'V' shaped) in which a width of a bottom surface of the recess channel trenches 160 may be less than a width of a top surface thereof. That is, a width of the recess channel trenches 160 may decrease as a depth thereof may increase.

Referring to FIG. 2B, it can be seen that, when the predetermined/desired region of the active regions 120 and the isolation regions 130 are removed together using the recessing process, cross sections of the recess channel trenches 160 taken along lines A-A' and C-C' may be in a symmetrical shape in which a level H10 of a bottom surface of isolation region 130 may be substantially identical to a level H11 of a bottom surface of active regions 120.

Referring to FIG. 2C, an annealing process of curing the silicon damaged by the high-density plasma may be performed. The annealing process may undergo in a hydrogen or oxygen atmosphere or other inert gases such as N2. Silicon atoms which exist in sidewalls of the recess channel trenches 160 can travel along the sidewalls to the bottom surface that is more thermally-stable compared to the sidewalls. The silicon atoms may be concentrated on the bottom surface of the recessed channel trench 160, such that the bottom surface may be lifted upwards. Due to uplift of the bottom surface, a horizontal width of the bottom surface may increase and a vertical depth of the bottom surface may decrease. Thus, a profile of the recess channel trenches 160 may be improved.

Referring to FIG. 2C, it can be seen that when the profile of the active regions 120 is improved, cross sections of the recess channel trenches 160 taken along line B-B may be a reversed trapezoidal shape (or alternatively, a 'U' shape) in which a width of a bottom surface of the recess channel trenches 160 may be the same as or similar to a top surface thereof. Thus, an area W of the bottom surface may increase from W11 of FIG. 2B to W12 of FIG. 2C, and a depth of the bottom surface may decrease from D11 of FIG. 2B to D12 of FIG. 2C.

Referring to FIG. 2C, it can be seen that cross sections of the recess channel trenches 160 taken along lines A-A' and C-C' may have a stepped shape. For example, there is no change in one side of the recess channel trenches 160 in contact with the isolation regions 130. But, the other side of the recess channel trenches 160 in contact with the active regions 120 may vary from level H11 to level H12. Thus, the profile of recess channel trenches 160 in contact with the active regions 120 is uplifted due to the annealing process, such that the level H12 of a bottom surface of the annealed active regions 120 may be higher by about 10 nm or higher than the level H10 of a bottom surface of the annealed isolation regions 130.

Referring to FIG. 2D, gate insulating layer (not show) may be formed along the profile of the recess channel trenches 160 using a chemical vapor deposition (CVD) technique and/or a thermal oxidation process. In this case, the gate insulating layer may be formed in-situ with the annealing process. The gate insulating layer may be a silicon oxide layer and/or a titanium oxide layer. Gate conductive layer (not shown) may be formed on the gate insulating layer using the CVD technique and/or a sputtering process to fill the recess channel trenches 160. The gate conductive layer may be a doped polysilicon (Poly-Si) layer, a metal layer and/or a metal compound layer.

The gate insulating layer and the gate conductive layer may be partially removed using a chemical mechanical polishing (CMP) technique and/or an etchback (E/B) technique to form gate insulating patterns 210 and gate conductive patterns 220. The gate conductive patterns 220 may have top surfaces that are lower than those of the substrate 100.

Gate capping layer (not shown) may be formed on the exposed gate conductive patterns 220. The capping layer may be a silicon oxide layer to protect the gate conductive patterns 220. Thereafter, until the top surface of the substrate 100 is exposed, the capping layer may be partially removed using a chemical mechanical polishing (CMP) technique and/or an etchback (E/B) technique to form gate capping patterns 230. The gate insulating pattern 210, the gate conductive patterns 220 and the gate capping patterns 230, which is stacked in each of the recess channel trenches 160, may constitute buried gate electrodes 200.

Impurity ions may be implanted in the substrate 100 to form source regions S and drain regions D on both sides of the buried gate electrodes 200. As a result, recessed-channel RC may be formed under the gate insulating patterns 210 by the source regions S and the drain regions D. Recessed channel array transistor (RCAT) including the buried gate electrodes 200, the source regions S and the drain regions D may be completed.

As described above, a length of recessed-channel RC may be increased such that the recessed-channels RC may be relatively unaffected by electric field of drain voltage.

FIGS. 3A through 3C are longitudinal sectional views taken along lines A-A', B-B' and C-C' of FIG. 1, which illustrate a method of manufacturing a semiconductor device according to example embodiments.

Referring to FIG. 3A, the active regions 120 may be formed in the substrate 100 using shallow trench isolation (STI) technique, the pad insulating layer 140 and mask layer 150 may be sequentially formed on the substrate 100 and patterned to form the pad insulating patterns 142 and the mask patterns 152 which expose a part of the top surfaces of the active regions 120 and the isolation regions 130.

Subsequently, a recessing process for forming the recessed channel trenches 160 in the substrate 100 using a high-density plasma dry etching technique may be performed.

Referring to FIG. 3A, it can be seen that, when the predetermined/desired region of the active regions 120 are removed using the recessing process, cross sections of the recessed channel trenches 160 taken along line B-B' may be cone shaped (or alternatively 'V' shaped) in which a width of a bottom surface of the recessed channel trenches 160 may be less wide than a width of a top surface thereof. As such, a width of the recessed channel trenches 160 may decrease as a depth thereof increases.

Referring to FIG. 3A, it can be seen that, when the predetermined/desired region of the active regions 120 and the isolation regions 130 are removed together using the recessing process, cross sections of the recessed channel trenches 160 taken along lines A-A' and C-C' may have different shapes in profiles of the active regions 120 and the isolation regions 130, respectively. Since the removal of these regions 120 and 130 is not uniformly performed, the recess channel trenches 160 may have a stepped shape. For example, the isolation regions 130 may have high selectivity with respect to the active regions 120 and the isolation regions 130 may be further etched under the active regions 120, such that a level H20 of a bottom surface of the recessed isolation region 130 may be lower than a level H21 of a bottom surface of the recessed active regions 120.

The annealing process may be performed in a hydrogen or oxygen atmosphere or other inert gases such as N2 to cure the silicon damaged by the high-density plasma.

Referring to FIG. 3B, it can be seen that when a profile of the active regions 120 are improved, cross sections of the recess channel trenches 160 taken along line B-B' may be a reversed trapezoidal shape (or alternatively, an 'U' shape) in which an width of a bottom surface of the recess channel trenches 160 may be the same as or similar to a top surface thereof. Thus, an area W of the bottom surface may increase from W21 of FIG. 3A to W22 of FIG. 3B, and a depth D of the bottom surface may decrease from D21 of FIG. 3A to D22 of FIG. 3B.

Referring to FIG. 3B, it can be seen that cross sections of the recess channel trenches 160 taken along lines A-A' and C-C' may have a stepped shape. For example, there is no change in one side of the recess channel trenches 160 in contact with the isolation regions 130. But, the other side of the recess channel trenches 160 in contact with the active regions 120 may vary from level H21 (FIG. 3A) to level H22 (FIG. 3B). Thus, the profile of recess channel trenches 160 in contact with the active regions 120 is lifted due to the annealing process, such that the level H22 (FIG. 3B) of a bottom surface of the annealed active regions 120 may be further higher than the level H20 (FIG. 3A) of a bottom surface of the annealed isolation regions 130 compared to the level H21 (FIG. 3A) of a bottom surface of the recessed active regions 120.

Referring to FIG. 3C, a process for forming the gate electrodes 200 including the gate insulating pattern 210, the gate conductive patterns 220 and the gate capping patterns 230, which is buried in each of the recess channel trenches 160, may be performed. Similarly, an ion implantation process for forming source regions S and drain regions D on both sides of the buried gate electrodes 200 in the substrate 100 may be performed.

FIGS. 4A through 4C are longitudinal sectional views taken along lines A-A', B-B' and C-C' of FIG. 1, which illustrate a method of manufacturing a semiconductor device according to example embodiments.

Referring to FIG. 4A, the active regions 120 may be formed in the substrate 100 using, for example, shallow trench isolation (STI) technique, the pad insulating layer 140 and mask layer 150 may be sequentially formed on the substrate 100 and patterned to form the pad insulating pattern 142 and the mask patterns 152 which expose a part of the top surfaces of the active regions 120 and the isolation region 130.

Thereafter, a recessing process for forming the recess channel trenches 160 in the substrate 100 using a plasma dry etching technique may be performed.

Referring to FIG. 4B, it can be seen that, when the predetermined/desired region of the active regions 120 are removed using the recessing process, cross sections of the recess channel trenches 160 taken along line B-B' may be a cone shape (or alternatively a 'V' shape) in which an width of a bottom surface of the recess channel trenches 160 may be less wide than a top surface thereof. That is, a width of the recess channel trenches 160 may decrease as a depth thereof may increase Referring to FIG. 4A, it can be seen that, when the predetermined/desired region of the active regions 120 and the isolation regions 130 are removed together using the recessing process, cross sections of the recess channel trenches 160 taken along lines A-A' and C-C' may have different shapes in profiles of the active regions 120 and the isolation regions 130, respectively. Since the removal of these regions 120 and 130 is not uniformly performed, the recess channel trenches 160 may have a stepped shape. For example, the active regions 120 may have high selectivity with respect to the isolation regions 130, the active regions 120 may be further etched under the isolation regions 130, such that a level H31 of a bottom surface of the recessed active regions 120 may be lower than a level H30 of a bottom surface of the recessed isolation regions 130.

The annealing process may be performed in a hydrogen or oxygen atmosphere or other inert gases such as N2 to cure the silicon damaged by the high-density plasma.

Referring to FIG. 4B, it can be seen that when a profile of the active regions 120 are improved, cross sections of the recess channel trenches 160 taken along line B-B' may be a reversed trapezoidal shape (or alternatively, an 'U' shape) in which an width of a bottom surface of the recess channel trenches 160 may be the same as or similar to a top surface thereof. Thus, an area W of the bottom surface may increase from W31 of FIG. 4A to W32 of FIG. 4B, and a depth D of the bottom surface may decrease from D31 of FIG. 4A to D32 of FIG. 4B.

Referring to FIG. 4B, it can be seen that cross sections of the recess channel trenches 160 taken along lines A-A' and C-C' may be planarized. For example, there is no change in one side of the recess channel trenches 160 in contact with the isolation regions 130. But, the other side of the recess channel trenches 160 in contact with the active regions 120 may vary from level H31 to level H32. Thus, the profile of recess channel trenches 160 in contact with the active regions 120 is uplifted due to the annealing process, such that the level H32 of a bottom surface of the active regions 120 may be substantially identical to a level H30 of a bottom surface of the annealed isolation regions 130.

Referring to FIG. 4C, a process for forming the gate electrodes 200 including the gate insulating pattern 210, the gate conductive patterns 220 and the gate capping patterns 230, which is buried in each of the recess channel trenches 160, may be performed. Similarly, an ion implantation process for forming source regions S and drain regions D on both sides of the buried gate electrodes 200 in the substrate 100 may be performed.

In addition, the names and functions of components not illustrated and/or described may be easily understood by one of ordinary skills with reference to drawings of the present specification and descriptions thereof.

According to the example embodiments as described above, a semiconductor device according to example embodiments may have at least one of the following effects.

First, since in RCAT active regions of a substrate are recessed to a predetermined/desired length, a length of recessed-channels increase. In particular, since the recessed actives regions protrude as a fin-type from isolation regions during an annealing process, a width of the recessed-channels increase.

Second, as a profile of recess channel trenches damaged by a plasma etch is cured by the annealing process, it is possible to prevent degradation in recess channel characteristic.

Third, when the isolation regions are recessed more than the active regions in recessing process, the relatively protruded active regions are further uplifted during annealing process. Therefore, the annealing process may provide for increasing the length of the recessed-channels as well as improving a profile of the active regions damaged by the plasma.

Fourth, when the active regions are recessed more than the isolation regions in recessing process, the relatively recessed active regions are uplifted during annealing process. Therefore, the annealing process may provide for a flat-type recessed-channel.

Fifth, the length of the recessed-channels increases to suppress short-channel effect and ensure the threshold voltage margin. Therefore, it is suitable for a three-dimensional transistor having a fast program operation speed.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A method of manufacturing a semiconductor device, comprising:
    forming at least one isolation region in a substrate, the at least one isolation region defining at least one active region;
    recessing a desired region of the at least one active region and the at least one isolation region to form a recessed channel trench of a desired depth,
        the recessed channel trench having a first region in contact with the at least one active region and a second region in contact with the at least one isolation region, and a width of a bottom surface of the recessed channel trench being less than a width of a top surface of the recessed channel trench;
    annealing the at least one active region and the at least one isolation region wherein the bottom surface of the recessed channel trench, is uplifted
        the annealing resulting in an increase in an area of the bottom surface of the first region, a reduction in a depth of the bottom surface of the first region, and a width of a bottom surface of the first region being substantially similar to a top surface of the first region, and the annealing process resulting in no change in the second region; and
    forming a buried gate electrode in the recessed channel trench.

2. The method of claim 1, wherein a level of the bottom surface of the first region is substantially identical to a level of the bottom surface of the second region during the recessing process, and
    wherein, during the annealing process, the level of the bottom surface of the first region is higher than the level of the bottom surface of the second region.

3. The method of claim 1, wherein a level of the bottom surface of the first region is higher than that of the bottom surface of the second region during the recessing process, and
    wherein, during the annealing process, the level of the bottom surface of the first region is substantially higher than the level of the bottom surface of the second region as compared to the level of the bottom surface during recessing process.

4. The method of claim 1, wherein the level of the bottom surface of the first region is lower than that of the bottom surface of the second region during the recessing process, and
    wherein, during the annealing process, the level of the bottom surface of the first region is substantially identical to the level of the bottom surface of the second region as compared to the level of the bottom surface during recessing process.

5. The method of claim 1, wherein recessing the at least one active region and the at least one isolation region includes performing a high-density plasma (HDP) dry etching process.

6. The method of claim 1, wherein annealing the at least one active region and the at least one isolation region includes performing a reflow process in a hydrogen or oxygen atmosphere.

7. The method of claim 1, wherein the at least one isolation region surrounds the at least one active region, the at least one active region is in a bar shape having a length greater than a width, and
    wherein the at least one active region is a portion of an array of active regions, and the recessed channel trench and the at least one active region are at an angle with respect to each other.

8. The method of claim 1, wherein the gate electrode includes a gate insulating pattern, a gate conductive pattern and a gate capping pattern, which are buried in the recessed channel trench.

9. The method of manufacturing the semiconductor device of claim 1, further comprising:
    recessing the desired region of the at least one active region and the at least one isolation region to form in the recessed channel trench, wherein
        the recessed channel trench includes at least one recessed-channel, and a level of the bottom surface of the recessed at least one active region is higher than a level of the bottom surface of the recessed at least one isolation region; and
    annealing the substrate, wherein
        a level of a bottom surface of the annealed at least one active region is substantially higher than a level of a bottom surface of the annealed at least one isolation region as compared to the level of the bottom surface of the recessed at least one active region.

10. The method of claim 9, wherein, during the recessing process, a width of the bottom surface of the recessed at least one active region is less than a width of the top surface of the recessed at least one active region, and
    wherein, compared to the recessing process, during the annealing process an area of the bottom surface of the annealed at least one active region increases, a level of the bottom surface of the annealed at least one active regions is uplifted by at least 10 nm and there is no change in the bottom surface of the annealed at least one isolation region.

11. The method of claim 9, wherein the annealed at least one active region protrudes from the at least one isolation region, and the at least one recessed-channel extends on three sides of a top surface and both sidewalls to form multi-channels of a fin-type.

12. The method of claim 9, wherein forming the at least one isolation region comprises:
    forming at least one isolation trench in the substrate using a photolithography and etching process;
    filling the at least one isolation trench with an insulating material; and
    removing the insulating material to expose the substrate.

13. The method of claim 9, wherein recessing the at least one active region and the at least one isolation region comprises:
    sequentially forming a pad insulating layer and a mask layer on the substrate;
    patterning the pad insulating layer and the mask layer to form pad insulating patterns and mask patterns which partially expose the at least one isolation region and the at least one active region; and partially removing the at least one isolation region and the at least one active region to a desired depth using the mask patterns as an etch mask.

14. The method of claim 9, wherein the level of the bottom surface of the recessed at least one active region is higher than the level of the bottom surface of the recessed isolation regions, and wherein the at least one isolation region has a high selectivity with respect to the at least one active region such that the at least one isolation region is etched more than the at least one active region.

15. The method of claim 10, further comprising:

forming a gate insulating layer along a profile of the recessed channel trench;

forming a gate conductive layer on the gate insulating layer;

partially removing the gate conductive layer and the gate insulating layer using a chemical mechanical polishing (CMP) technique or an etchback (E/B) technique to form gate insulating patterns and gate conductive patterns, the gate conductive patterns having top surfaces that are lower than the top surface of the substrate;

forming a gate capping layer on the gate conductive patterns; and partially removing the gate capping layer using a chemical mechanical polishing (CMP) technique or an etchback (E/B) till the substrate is exposed, thereby forming gate capping patterns.

16. The method of manufacturing the semiconductor device of claim 1, further comprising:

recessing the desired region of the at least one active region and the at least one isolation region to form the recessed channel trench including at least one recessed-channel, wherein a level of the bottom surface of the recessed at least one active region is lower than a level of a bottom surface of the recessed at least one isolation region; and annealing the substrate, wherein a level of a bottom surface of the annealed at least one active region is substantially identical to a level of a bottom surface of the annealed at least one isolation region.

17. The method of claim 16, wherein, during the recessing process, a width of the bottom surface of the recessed at least one active region is less than a width of the top surface of the recessed at least one active region, and wherein, compared to the recessing process, during the annealing process an area of the bottom surface of the annealed at least one active region increases, a level of the bottom surface of the annealed at least one active region is uplifted and there is no change in the bottom surface of the annealed at least one isolation region.

18. The method of claim 16, wherein recessing the at least one active region and the at least one isolation region includes performing a high-density plasma (HDP) dry etching process, and wherein annealing the at least one active region and the at least one isolation region includes performing a reflow in a N2 atmosphere for curing the silicon damaged by the high-density plasma.

19. The method of claim 16, further comprising:

forming a gate insulating layer along a profile of the recessed channel trench in-suit with the annealing process;

forming a gate conductive layer on the gate insulating layer using a chemical vapor deposition (CVD) technique;

partially removing the gate conductive layer and the gate insulating layer using an etchback (E/B) technique to form gate insulating patterns and gate conductive patterns, wherein the gate conductive patterns have top surfaces that are lower than those of the substrate;

forming a gate capping layer on the gate conductive patterns using a chemical vapor deposition (CVD) technique; and partially removing the capping layer using a chemical mechanical polishing (CMP) technique until a top surface of the substrate is exposed to form gate capping patterns.

20. The method of claim 19, further comprising:

forming source regions and drain regions using the capping patterns as an ion implantation mask, wherein vertical-type recessed-channels are formed under the gate insulating patterns by the source regions and the drain regions.

* * * * *